(12) United States Patent
Lee et al.

(10) Patent No.: US 9,728,485 B1
(45) Date of Patent: Aug. 8, 2017

(54) SEMICONDUCTOR DEVICE WITH INTERCONNECT STRUCTURE HAVING CATALYS LAYER

(71) Applicant: Taiwan Semiconductor Manufacturing Co., Ltd., Hsinchu (TW)

(72) Inventors: Ming-Han Lee, Taipei (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/016,886

(22) Filed: Feb. 5, 2016

(51) Int. Cl.
| | | |
|---|---|---|
| H01L 23/373 | (2006.01) | |
| H01L 23/532 | (2006.01) | |
| H01L 23/522 | (2006.01) | |
| H01L 23/528 | (2006.01) | |
| H01L 21/768 | (2006.01) | |

(52) U.S. Cl.
CPC .... *H01L 23/3736* (2013.01); *H01L 21/76804* (2013.01); *H01L 21/76843* (2013.01); *H01L 21/76879* (2013.01); *H01L 23/528* (2013.01); *H01L 23/5226* (2013.01); *H01L 23/53204* (2013.01)

(58) Field of Classification Search
CPC .............. H01L 23/3736; H01L 21/6804
See application file for complete search history.

(56) References Cited

U.S. PATENT DOCUMENTS

| | | | |
|---|---|---|---|
| 2007/0065585 A1* | 3/2007 | Chebiam | H01L 21/288 427/282 |
| 2007/0292603 A1* | 12/2007 | Dordi | H01L 21/0206 427/98.1 |
| 2015/0061133 A1* | 3/2015 | Isobayashi | H01L 23/49877 257/746 |
| 2015/0270225 A1 | 9/2015 | Yang et al. | |

\* cited by examiner

*Primary Examiner* — Dung Le
(74) *Attorney, Agent, or Firm* — Birch, Stewart, Kolasch & Birch, LLP (57) ABSTRACT

A semiconductor device structure is provided. The semiconductor device structure includes a semiconductor substrate and a dielectric layer over the semiconductor substrate. The semiconductor device structure also includes a conductive feature in the dielectric layer, and the conductive feature includes a catalyst layer and a conductive element. The catalyst layer is between the conductive element and the dielectric layer, and the catalyst layer is in physical contact with the conductive element. The catalyst layer continuously surrounds a sidewall and a bottom of the conductive element. The catalyst layer is made of a material different from that of the conductive element, and the catalyst layer is capable of lowering a formation temperature of the conductive element.

20 Claims, 8 Drawing Sheets

SEMICONDUCTOR DEVICE WITH INTERCONNECT STRUCTURE HAVING CATALYS LAYER

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while feature size (such as the smallest component that can be created using a fabrication process) has decreased. This scaling-down process generally provides benefits by increasing production efficiency and lowering associated costs.

One method used by the industry to meet the demands for device density is the adoption of damascene and/or dual-damascene structures for interconnection structures. In a damascene process, an underlying insulating layer is patterned with trenches and/or via holes. Afterwards, a conductor is deposited and polished to target thickness to form a patterned conductor feature. Dual-damascene processes use a similar approach and form and fill two features (such as a trench and a via hole) with a single deposition of conductor.

However, as feature sizes shrink further and density requirements increase, the pitch between features, such as interconnect structures, decreases. As a result, fabrication processes continue to become more difficult to perform. It is a challenge to form interconnection structures with smaller and smaller pitches in a semiconductor device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1A:
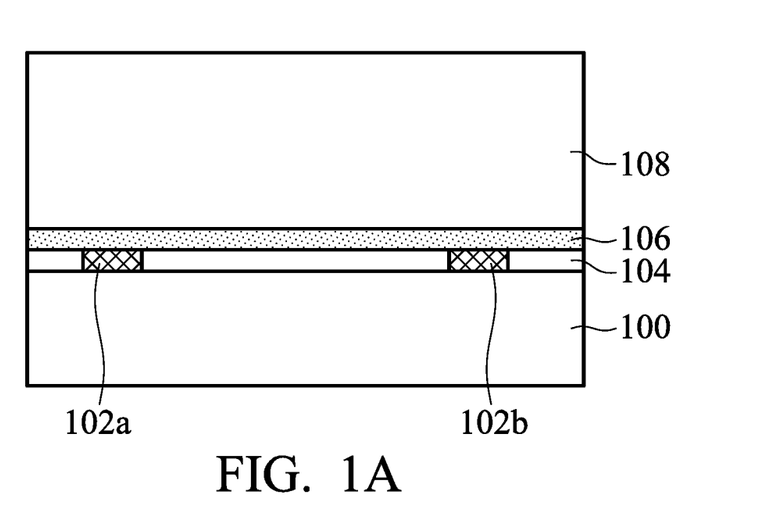
FIGS. 1A-1D are cross-sectional views of various stages of a process for forming a semiconductor device structure, in accordance with some embodiments.

FIGS. 1A-1D are cross-sectional views of various stages of a process for forming a semiconductor device structure, in accordance with some embodiments. As shown in FIG. 1A, a semiconductor substrate 100 is provided. In some embodiments, the semiconductor substrate 100 includes a semiconductor wafer, a portion of a semiconductor wafer, or a semiconductor die. The semiconductor wafer (such as a silicon wafer) may contain device elements such as active devices and/or passive devices. In some embodiments, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, an interconnection structure is formed on the semiconductor substrate 100. The interconnection structure includes an interlayer dielectric layer 104 and multiple conductive features including conductive features 102a and 102b. The conductive features 102a and 102b may include conductive lines, conductive vias, and/or conductive contacts. In some embodiments, the interlayer dielectric layer 104 includes multiple dielectric sub-layers. Multiple conductive features such as conductive contacts, conductive vias, and conductive lines are formed in the interlayer dielectric layer 104.

Afterwards, one or more dielectric layers and conductive features are formed on the conductive features 102a and 102b and the interlayer dielectric layer 104 to continue the formation of the interconnection structure. In some embodiments, various device elements are formed in the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other suitable processes.

The device elements are interconnected through the interconnection structure over the semiconductor substrate 100 to form integrated circuit devices. For example, one of the conductive features 102a and 102b may be electrically connected to a doped region formed in the semiconductor substrate 100 through some of the conductive vias, some other conductive features 102a and 102b, and/or some of the conductive contacts. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

As shown in FIG. 1A, an etch stop layer 106 and a dielectric layer 108 are deposited over the interlayer dielectric layer 104 and the conductive features 102a and 102b, in accordance with some embodiments. The etch stop layer 106 may be used to assist in the formation of feature openings that will be formed in the dielectric layer 108. In some embodiments, the etch stop layer 106 is made of silicon nitride, silicon oxynitride, silicon carbide, silicon carbon nitride, another suitable material, or a combination thereof. In some embodiments, the etch stop layer 106 is deposited using a chemical vapor deposition (CVD) process, an atomic layer deposition (ALD) process, a spin-on process, another applicable process, or a combination thereof. Many variations and/or modifications can be made to embodiments of the disclosure. In some other embodiments, the etch stop layer 106 is not formed.

In some embodiments, the dielectric layer 108 is made of silicon oxide, silicon oxynitride, borosilicate glass (BSG), phosphoric silicate glass (PSG), borophosphosilicate glass (BPSG), fluorinated silicate glass (FSG), low dielectric constant (low-k) material, another suitable material, or a combination thereof. In some embodiments, the dielectric layer 108 includes multiple sub-layers. In some embodiments, the dielectric layer 108 is deposited using a CVD process, an ALD process, a spin-on process, another applicable process, or a combination thereof.

The low-k material may a dielectric constant smaller than that of silicon dioxide. For example, the low-k material has a dielectric constant in a range from about 1.5 to about 3.5. As the density of semiconductor devices increases and the size of circuit elements becomes smaller, the resistance capacitance (RC) delay time increasingly dominates circuit performance. Therefore, using a low-k dielectric material as the dielectric layer 108 is helpful for reducing the RC delay.

A wide variety of low-k material may be used for forming the dielectric layer 108. In some embodiments, the dielectric layer 108 includes a spin-on inorganic dielectric, a spin-on organic dielectric, a porous dielectric material, an organic polymer, an organic silica glass, SiOF series material, a hydrogen silsesquioxane (HSQ) series material, a methyl silsesquioxane (MSQ) series material, a porous organic series material, another suitable material, or a combination thereof.

Figure 1B:
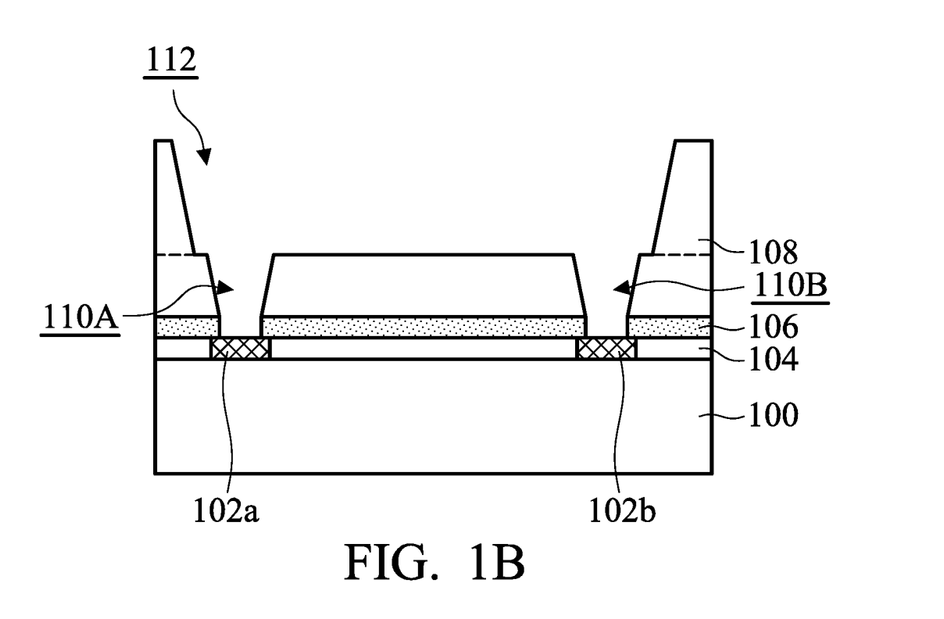

Afterwards, feature openings are formed in the dielectric layer 108, as shown in FIG. 1B in accordance with some embodiments. In some embodiments, the feature openings include a trench 112 and via holes 110A and 110B. The trench 112 connects with the via holes 110A and 110B. In some embodiments, each of the via holes 110A and 110B extends from a bottom of the trench 112 towards the conductive features (such as the conductive features 102a and 102b) formed in the interlayer dielectric layer 104. In some embodiments, the via holes 110A and 110B penetrate through the etch stop layer 106 and respectively expose the conductive features 102a and 102b.

The formation of the feature openings may involve multiple photolithography processes and etching processes. In some embodiments, the trench 112 is formed before the formation of the via holes 110A and 110B. In some other embodiments, the trench 112 is formed after the formation of the via holes 110A and 110B. In some embodiments, an etching process is used to partially remove the etch stop layer 106 so that the conductive features 102a and 102b are exposed by the via holes 110A and 110B.

Figure 1C:
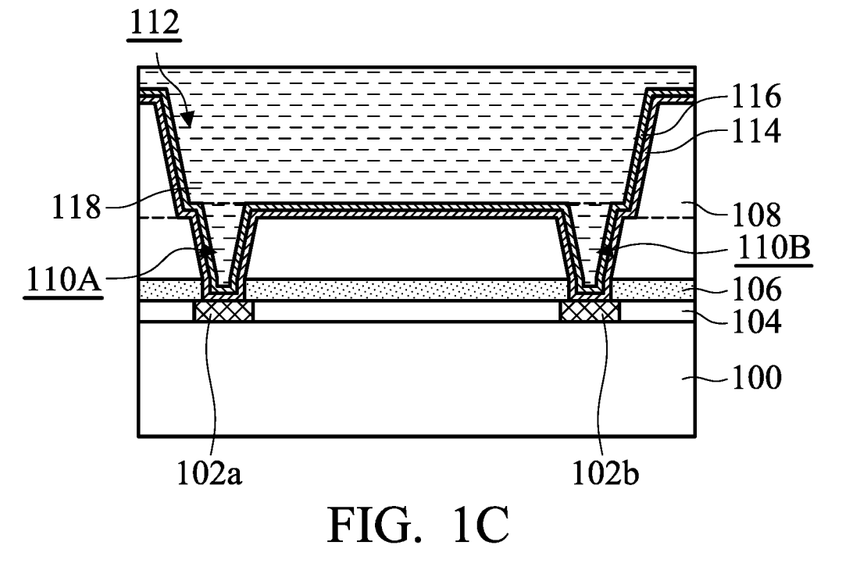

As shown in FIG. 1C, a barrier layer 114 is deposited over sidewalls of the trench 112 and sidewalls and bottoms of the via holes 110A and 110B, in accordance with some embodiments. The barrier layer 114 may be used to prevent metal ions of conductive features that will be formed in the feature openings from diffusing into the dielectric layer 108. In some embodiments, the barrier layer 114 includes multiple sub-layers including a glue layer. The glue layer may be used to improve adhesion between the barrier layer 114 and a subsequently formed layer.

In some embodiments, the barrier layer 114 is made of titanium nitride (TiN), tantalum nitride (TaN), Ta, Ti, TiW, another suitable material, or a combination thereof. The glue layer may be made of Ta, Ti, another suitable material, or a combination thereof. In some embodiments, the barrier layer 114 is deposited using a PVD process, a CVD process, an ALD process, an electroplating process, an electroless plating process, another applicable process, or a combination thereof. Many variations and/or modifications can be made to embodiments of the disclosure. In some other embodiments, the barrier layer 114 is not formed.

Afterwards, a catalyst layer 116 and a conductive layer 118 are deposited over the barrier layer 114 to fill the trench 112 and the via holes 110A and 110B, as shown in FIG. 1C in accordance with some embodiments. In some embodiments, the conductive layer 118 fills a space surrounded by the catalyst layer 116. As shown in FIG. 1C, the conductive layer 118 fills the remaining portions of the feature openings (i.e., the space surrounded by the catalyst layer 116).

The catalyst layer 116 may be used to facilitate the formation of the conductive layer 118. In some embodiments, the catalyst layer 116 is capable of lowering a formation temperature of the conductive layer 118. In some embodiments, with the assistance of the catalyst layer 116, the formation temperature of the conductive layer 118 is reduced to be lower than about 400 degrees C. In some embodiments, the formation temperature of the conductive layer 118 is in a range from about 25 degrees C. to 400 degrees C. In some embodiments, the catalyst layer 116 is in physical (or direct) contact with the conductive layer 118.

In some embodiments, the catalyst layer 116 is electrically conductive. In some embodiments, the catalyst layer 116 is made of a material that is different from that of the conductive layer 118. In some embodiments, the catalyst layer 116 includes copper (Cu), nickel (Ni), platinum (Pt), cobalt (Co), ruthenium (Ru), another suitable material, or a combination thereof. In some other embodiments, the catalyst layer 116 is made of Cu, Ni, Pt, Co, Ru, another suitable material, or a combination thereof. In some embodiments, the catalyst layer 116 is deposited using a PVD process, a CVD process, an electroplating process, an electroless plating process, an ALD process, another applicable process, or a combination thereof.

In some embodiments, the conductivity of the conductive layer 118 is greater than that of the catalyst layer 116. In some embodiments, the conductivity of the conductive layer 118 is greater than that of copper. In some embodiments, the conductive layer 118 has a better electromigration resistance than copper. In some cases, the resistivity of Cu increases at small dimension. Using the conductive layer 118 with greater conductivity may help to ensure the quality of the interconnection structure.

In some embodiments, the conductive layer 118 includes two-dimensional (2D) material. The 2D material may include a stack of 2D layers. The atoms of each of the 2D layer may be held together via intra-layer covalent and/or ion bonds between atoms. Substantially weaker forces (e.g., van der Waals forces) may hold adjacent 2D layers of the stack together. In some embodiments, the conductive layer 118 includes multiple atomic layers that are connected together by Van der Waals' force between the atomic layers.

Figure 3:
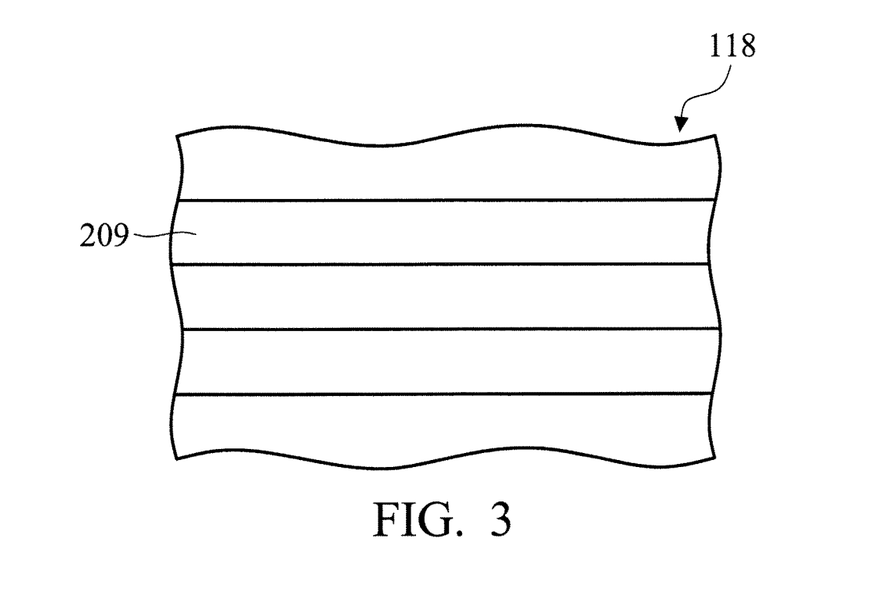
FIG. 3 is a cross-sectional view of a portion of a semiconductor device structure, in accordance with some embodiments.

FIG. 3 is a cross-sectional view of a portion of the conductive layer 118, in accordance with some embodiments. In some embodiments, the conductive layer 118 includes multiple sub-layers 209. In some embodiments, each of the sub-layers 209 is an atomic layer. In some embodiments, the atomic layers are held together by Van der Waals' force between the atomic layers.

In some embodiments, the conductive layer 118 includes graphene, doped graphene, graphene oxide, graphene-containing compound, transition-metal chalcogenide, boron nitride, another suitable material, or a combination thereof. In some other embodiments, the conductive layer 118 is made of graphene, doped graphene, graphene oxide, graphene-containing compound, transition-metal chalcogenide, boron nitride, another suitable material, or a combination thereof. In some embodiments, the conductive layer 118 is deposited using a CVD process, an ALD process, an electroplating process, an electroless plating process, a PVD process, another applicable process, or a combination thereof.

In some embodiments, due to the catalyst layer 116, the formation temperature of the conductive layer 118 is significantly reduced. In some embodiments, the conductive layer 118 is made of a carbon-containing conductive material (such as graphene), and is grown on the catalyst layer 116 using a thermal CVD process. In some embodiments, a carbon-containing gas is used as a reaction gas for growing the conductive layer 118. In some embodiments, a gas mixture including methane ($CH_4$), argon (Ar), and hydrogen ($H_2$) is used as the reaction gas for growing a conductive material that may have a better gap-filling ability than copper. As a result, the conductive layer 118 is formed. The formation temperature is significantly reduced to be smaller than about 400 degrees C. In some embodiments, the formation temperature of the conductive layer 118 is in a range from about 25 degrees C. to about 400 degrees C.

Figure 1D:
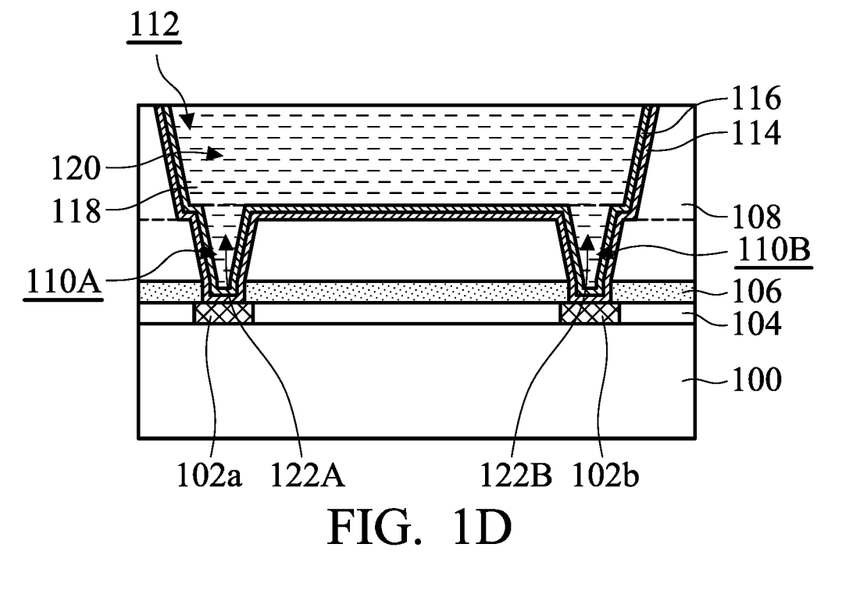

As shown in FIG. 1D, a planarization process is used to remove the portions of the conductive layer 118, the catalyst layer 116, and the barrier layer 114 outside of the trench 112, in accordance with some embodiments. As a result, the remaining portions of these layers form conductive features 122A, 122B, and 120, as shown in FIG. 1D. In some embodiments, the planarization process includes a chemical mechanical polishing (CMP) process, a grinding process, a dry polishing process, an etching process, another applicable process, or a combination thereof. In some embodiments, the top surfaces of the dielectric layer 108, the conductive layer 118, and the catalyst layer 116 are substantially coplanar.

In some embodiments, the portions of the conductive layer 118, the catalyst layer 116, and the barrier layer 114 in the via holes 110A and 110B form the conductive features 122A and 122B. In some embodiments, the conductive features 122A and 122B are used as conductive vias. In some embodiments, the portions of the conductive layer 118, the catalyst layer 116, and the barrier layer 114 in the trench 112 form the conductive feature 120. In some embodiments, the conductive feature 120 is used as a conductive line.

Many variations and/or modifications can be made to embodiments of the disclosure. FIGS. 2A-2G are cross-sectional views of various stages of a process for forming a semiconductor device structure, in accordance with some embodiments.

Figure 2A:
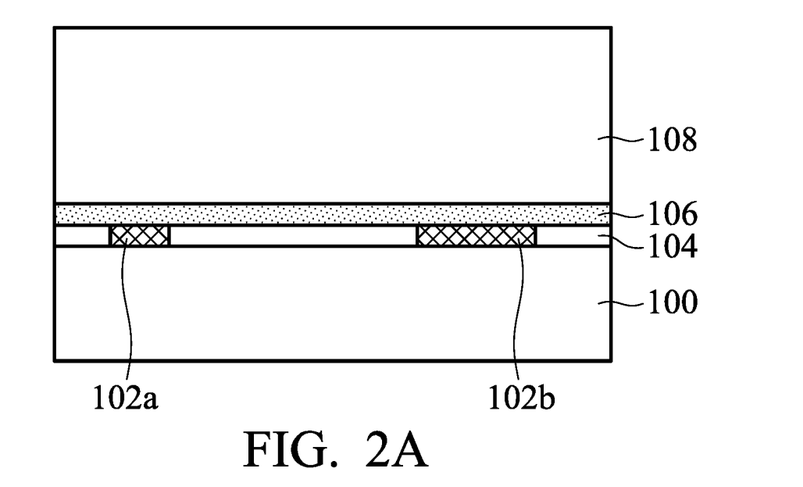
FIGS. 2A-2G are cross-sectional views of various stages of a process for forming a semiconductor device structure, in accordance with some embodiments.
Figure 2B:
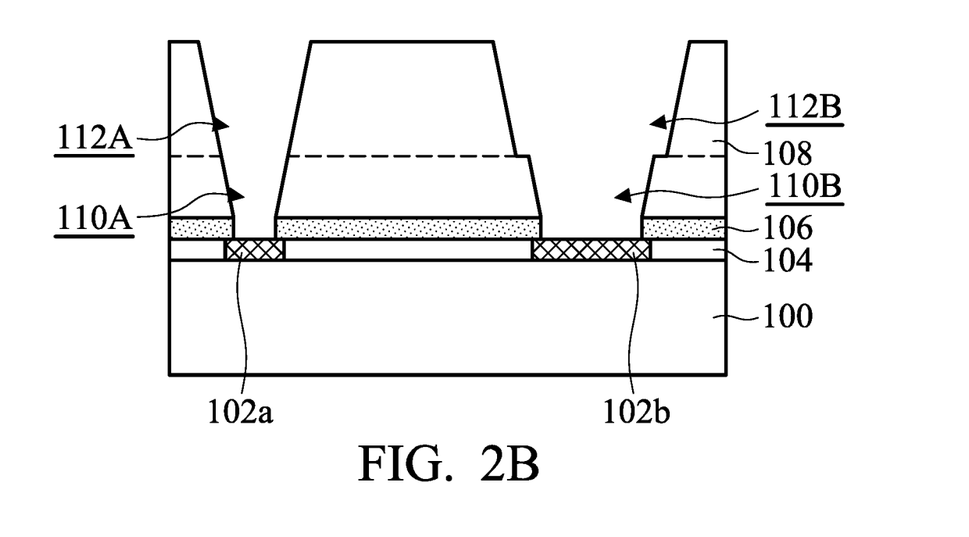

As shown in FIG. 2A, a structure similar to the structure shown in FIG. 1A is provided. Afterwards, feature openings are formed in the dielectric layer 108, as shown in FIG. 2B in accordance with some embodiments. In some embodiments, the feature openings include via holes 110A and 110B and trenches 112A and 112B.

Figure 4:
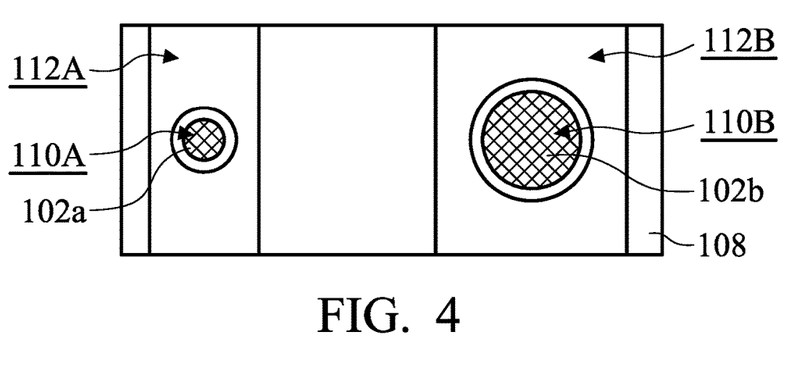
FIG. 4 is a top view of a portion of a semiconductor device structure, in accordance with some embodiments.

FIG. 4 is a top view of a portion of a semiconductor device structure, in accordance with some embodiments. In some embodiments, FIG. 4 is a top view of the structure shown in FIG. 2B. In some embodiments, the trench 112B is wider than the trench 112A. In some embodiments, the via hole 110B is wider than the via hole 110A. Multiple photolithography and etching processes may be used to form via holes 110A and 110B and trenches 112A and 112B. In some embodiments, the trenches 112A and 112B are formed before the formation of the via holes 110A and 110B. In some other embodiments, the trenches 112A and 112B are formed after the formation of the via holes 110A and 110B.

Figure 2C:
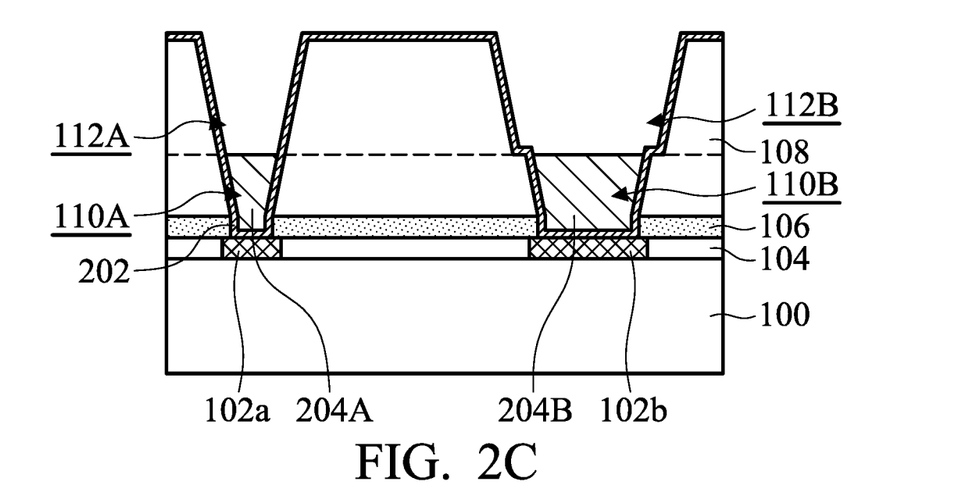

As shown in FIG. 2C, a barrier layer 202 is deposited over sidewalls and bottoms of the feature openings, in accordance with some embodiments. In some embodiments, the material and formation method of the barrier layer 202 are similar to or the same as those of the barrier layer 114. However, embodiments of the disclosure are not limited thereto. In some other embodiments, the barrier layer 202 is not formed.

Afterwards, conductive features 204A and 204B are respectively formed in the via holes 110A and 110B, as shown in FIG. 2C in accordance with some embodiments. The conductive features 204A and 204B may be used as conductive vias. In some embodiments, the conductive features 204A and 204B are made of copper, cobalt, nickel, aluminum, titanium, tungsten, gold, platinum, carbon-containing conductive material (such as graphene-containing material and/or carbon nanotube-containing material), another suitable material, or a combination thereof. In some embodiments, the conductive features 204A and 204B are formed using an electroless plating process, an electroplating process, a CVD process, another applicable process, or a combination thereof. In some embodiments, the conductive features 204A and 204B are formed using a selective deposition process such as an electroless plating process or a selective CVD process.

Figure 2D:
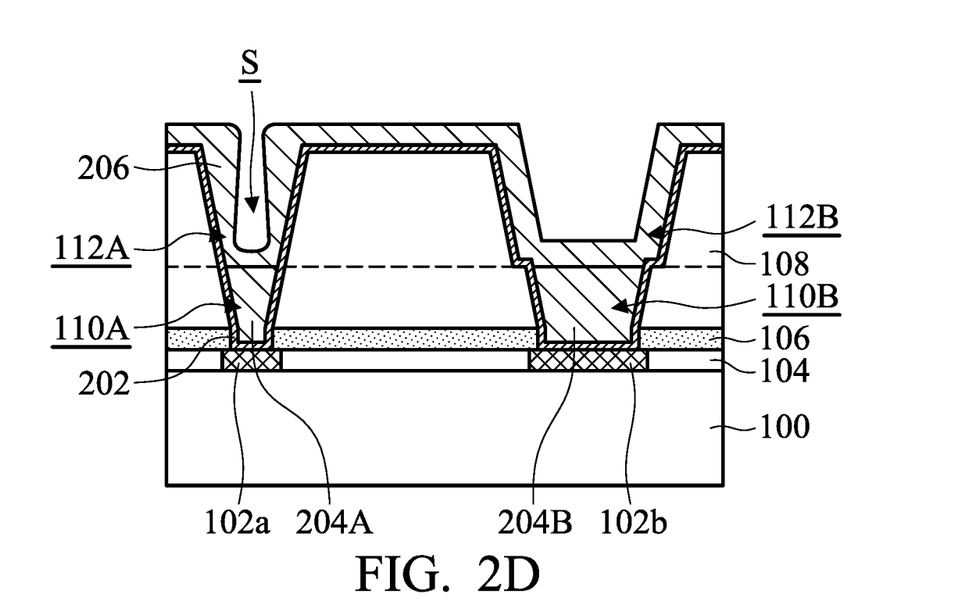

As shown in FIG. 2D, a catalyst layer 206 is deposited over the sidewalls and bottoms of the trenches 112A and 112B, in accordance with some embodiments. In some embodiments, the material and formation method of the catalyst layer 206 are similar to or the same as those of the catalyst layer 116. In some embodiments, the portion of the catalyst layer 206 in the trench 112A has various thicknesses due to the smaller width of the trench 112A. In some embodiments, the portion of the catalyst layer 206 over the sidewall of the trench 112A gradually becomes thicker along a direction from the bottom towards the top of the trench 112A, as shown in FIG. 2D. A space (or gap) S surrounded by the catalyst layer 206 is therefore formed.

Figure 2E:
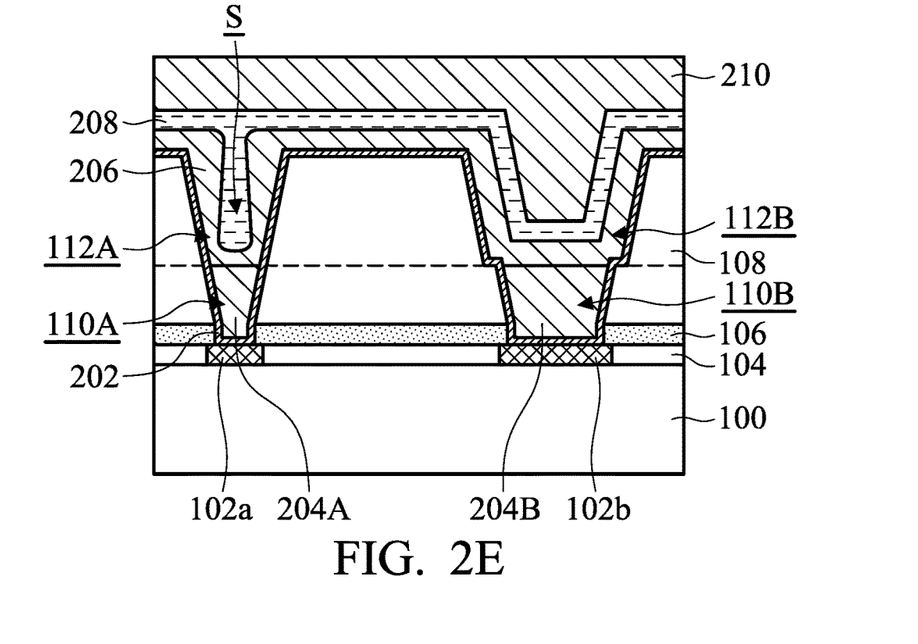

As shown in FIG. 2E, a conductive layer 208 is deposited over the catalyst layer 206, in accordance with some embodiments. In some embodiments, the material and formation method of the conductive layer 208 are similar to or the same as those of the conductive layer 118. In some embodiments, the portion of the conductive layer 208 in the trench 112A fills the space S surrounded by the catalyst layer 206. In some embodiments, the portion of the conductive layer 208 in the trench 112B conformally covers the catalyst layer 206.

In some embodiments, the conductive layer 208 is made of a 2D material (such as graphene) that is formed using a CVD or ALD process. Therefore, the conductive layer 208 may have a better gap-filling ability. Accordingly, the conductive layer 208 can substantially fill the space S surrounded by the catalyst layer 206 without (or substantially without) leaving a void formed in the conductive layer 208. The quality and reliability of the conductive layer 208 are significantly improved.

Afterwards, another conductive layer 210 is deposited over the conductive layer 208, as shown in FIG. 2E in accordance with some embodiments. In some embodiments, the conductive layer 210 fills the remaining portion of the trench 112B. In some embodiments, the conductive layer 210 is made of a material that is different from that of the conductive layer 208. In some embodiments, the conductive layer 210 is made of a material that is similar to or the same as that of the catalyst layer 206. In some embodiments, the conductive layer 210 is made of Cu, Ni, Pt, Co, Ru, another suitable material, or a combination thereof. In some embodiments, the conductive layer 210 is deposited using an electroplating process, a CVD process, a PVD process, an electroless plating process, an ALD process, another applicable process, or a combination thereof.

Many variations and/or modifications can be made to embodiments of the disclosure. In some other embodiments, the conductive layer 210 is not formed.

Figure 2F:
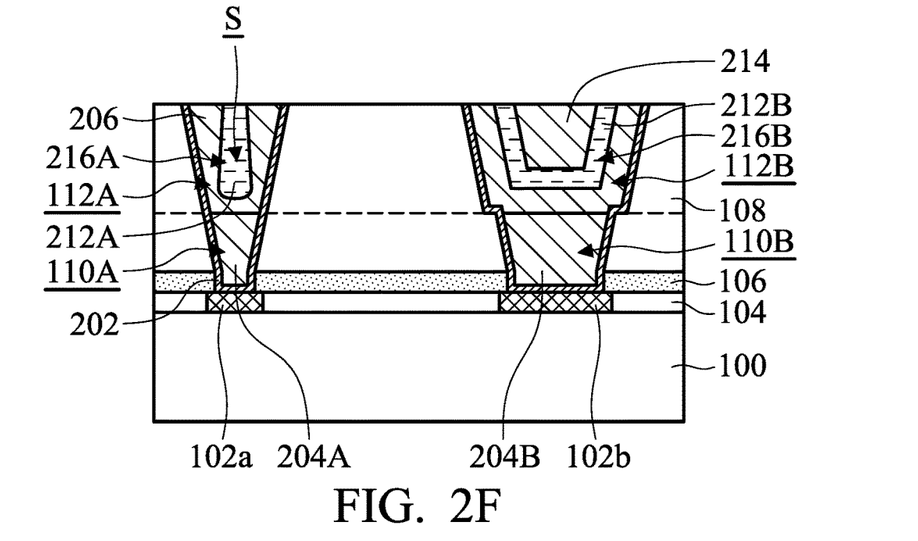

As shown in FIG. 2F, a planarization process is used to remove the portions of the conductive layer 210, the conductive layer 208, the catalyst layer 206, and the barrier layer 202 outside of the trenches 112A and 112B, in accordance with some embodiments. As a result, conductive features 216A and 216B are formed. In some embodiments, the top surfaces of the dielectric layer 108 and the conductive features 216A and 216B are substantially coplanar, as shown in FIG. 2F.

As shown in FIG. 2F, the portion of the conductive layer 208 in the trench 112A forms a conductive element 212A. In some embodiments, the catalyst layer 206 continuously surrounds and/or covers the sidewall and the bottom of the conductive element 212A, as shown in FIG. 2F. In some embodiments, a portion of the conductive element 212A gradually becomes wider along a direction from the top towards the bottom of the conductive element 212A, as shown in FIG. 2F. In some embodiments, the conductive element 212A has greater conductivity than copper. In some embodiments, the conductive element 212A has a better electromigration resistance than copper. Therefore, the quality and reliability of the conductive feature 216A are improved.

As shown in FIG. 2F, the portion of the conductive layer 208 in the trench 112B forms a conductive element 212B. In some embodiments, the catalyst layer 206 continuously surrounds and/or covers the sidewall and the bottom of the conductive element 212B, as shown in FIG. 2F. In some embodiments, the thickness of the conductive element 212B is in a range from about 1 nm to about 15 nm. The portion of the conductive layer 210 in the trench 112B forms another conductive element 214. In some embodiments, the conductive element 214 is surrounded by the conductive element 212B, as shown in FIG. 2F. In some embodiments, the conductive element 214 is made of a material that is different from that of the conductive element 212B. In some embodiments, the conductive element 214 is made of a material that is substantially the same as or similar to that of the catalyst layer 206. Due to the conductive element 212B that has good conductivity and electromigration resistance, the quality and reliability of the conductive feature 216B are improved.

In some embodiments, the conductive feature 216A includes the conductive element 212A and the portions of the catalyst layer 206 and the barrier layer 202 in the trench 112A. In some embodiments, the conductive feature 216B includes the conductive element 212B, the conductive element 214, and the portions of the catalyst layer 206 and the barrier layer 202 in the trench 112B. In some embodiments, the conductive features 216A and 216B are used as conductive lines. However, embodiments of the disclosure are not limited thereto. In some other embodiments, the conductive features 216A and 216B are formed in via holes, and are used as conductive vias.

Figure 2G:
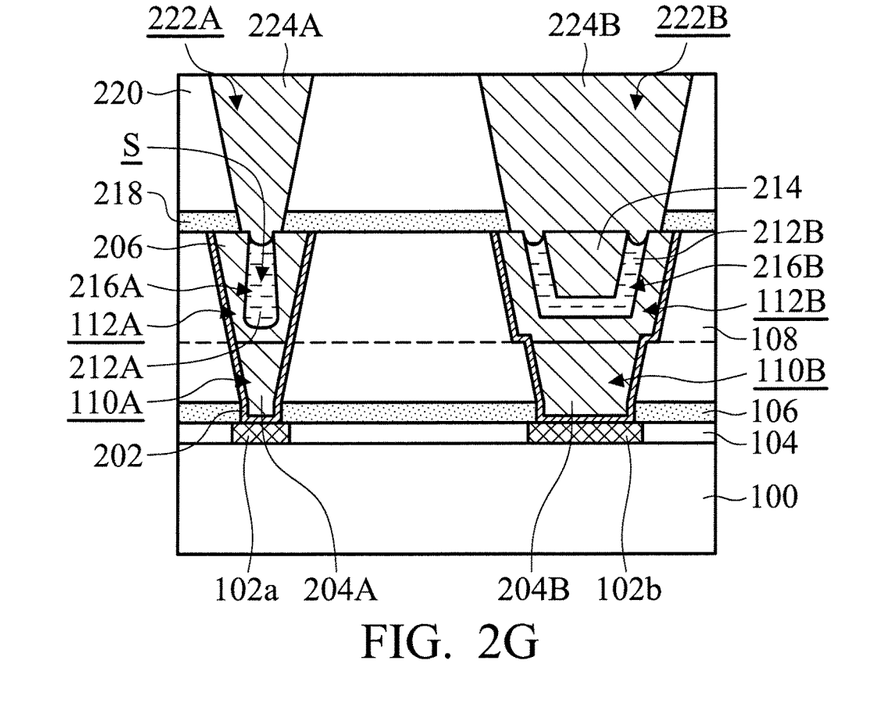

As shown in FIG. 2G, an etch stop layer 218 is deposited over the dielectric layer 108 and the conductive features 216A and 216B, in accordance with some embodiments. In some embodiments, the material and formation method of the etch stop layer 218 are similar to or the same as the etch stop layer 106. In some other embodiments, the etch stop layer 218 is not formed.

Afterwards, a dielectric layer 220 is deposited over the etch stop layer 218, as shown in FIG. 2G in accordance with some embodiments. In some embodiments, the material and formation method of the dielectric layer 220 are similar to or the same as those of the dielectric layer 108.

In some embodiments, openings (such as via holes) 222A and 222B are formed in the dielectric layer 220, as shown in FIG. 2G. The openings 222A and 222B penetrate through the etch stop layer 218 to expose the conductive features 216A and 216B. In some embodiments, one or more photolithography processes and etching processes are used to form the openings 222A and 222B.

In some embodiments, the openings 222A and 222B extend into the conductive elements 212A and 212B, respectively. The openings 222A may extend into the conductive element 212A deeper than the catalyst layer 206 due to higher etching rate of the conductive element 212A. Similarly, the openings 222B may extend into the conductive element 212B deeper than the catalyst layer 206 or the conductive element 214 since the conductive element 212B is etched at a higher etching rate than the catalyst layer 206 or the conductive element 214. In some embodiments, the top surfaces of the catalyst layer 206 and the conductive element 212A or 212B are not coplanar, as shown in FIG. 2G. In some embodiments, the top surfaces of the conductive element 212B and the conductive element 214 are not coplanar.

As shown in FIG. 2G, conductive features 224A and 224B respectively are formed in the openings 222A and 222B, in accordance with some embodiments. In some embodiments, the conductive features 224A and 224B extend into the conductive elements 212A and 212B, respectively. In some embodiments, the bottom of the conductive feature 224A is between the top of the conductive element 212A and the top of the catalyst layer 206, as shown in FIG. 2G. In some embodiments, the bottom of the conductive feature 224B is between the top of the conductive element 212B and the top of the catalyst layer 206, as shown in FIG. 2G. In some embodiments, the bottom of the conductive feature 224B is between the top of the conductive element 212B and the top of the conductive element 214 that is surrounded by the conductive element 212B, as shown in FIG. 2G.

In some embodiments, the material and formation method of the conductive features 224A and 224B are similar to or the same as those of the conductive features 204A or 204B. In some other embodiments, the material and formation method of the conductive features 224A and 224B are similar to or the same as those of the conductive features 216A or 216B. Embodiments of the disclosure are not limited thereto. In some other embodiments, the dielectric layer 220 and the conductive features 224A and 224B are not formed.

Figure 5:
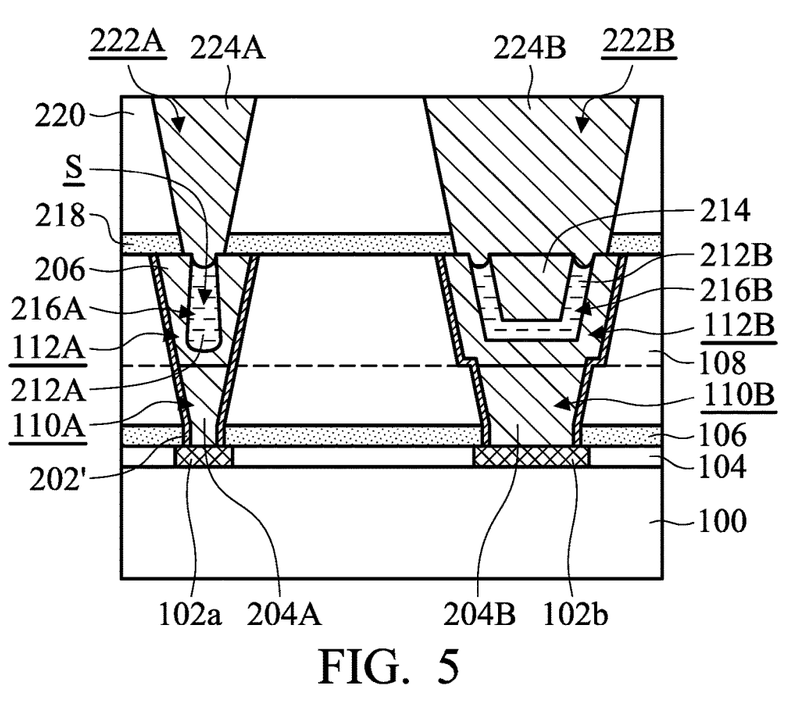
FIG. 5 is a cross-sectional view of a semiconductor device structure, in accordance with some embodiments.

Many variations and/or modifications can be made to embodiments of the disclosure. FIG. 5 is a cross-sectional view of a semiconductor device structure, in accordance with some embodiments. The structure shown in FIG. 5 is similar to the structure shown in FIG. 2G. In some embodiments, a bottom portion of the barrier layer 202 is removed to form a patterned barrier layer 202' before the formation of the conductive elements 204A and 204B. The barrier layer 202' has openings that expose the conductive features 102*a* and 102*b*. In some embodiments, after the formation of the conductive features 204A and 204B, the conductive features 204A and 204B are in physical contact with the conductive features 102*a* and 102*b*, respectively.

In some embodiments, the conductive features 204A and 204B are formed using a selective deposition process such as an electroless plating process or a selective CVD process. The conductive material is selectively deposited only on the metal surface without on the surface of the dielectric layer 108.

Figure 6A:
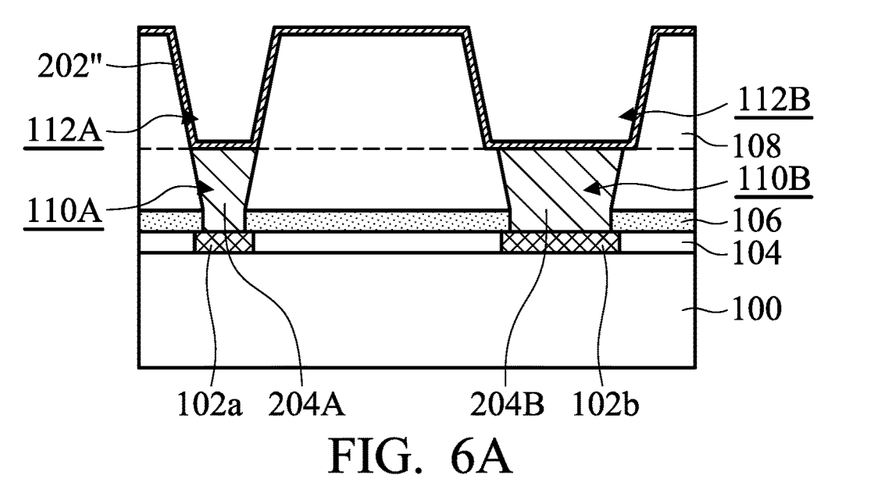
FIGS. 6A-6B are cross-sectional views of various stages of a process for forming a semiconductor device structure, in accordance with some embodiments.
Figure 6B:
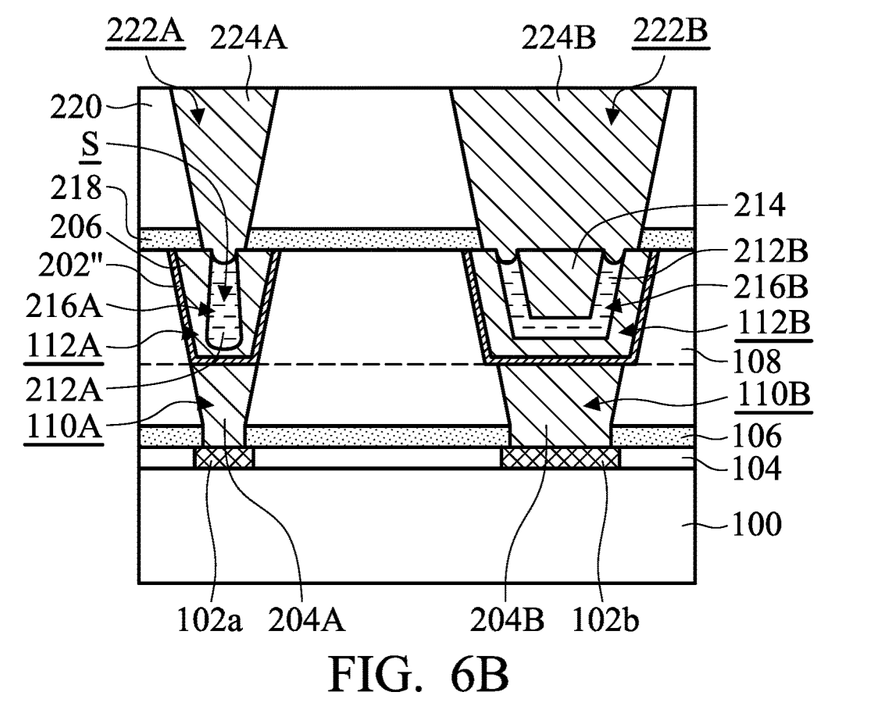

Many variations and/or modifications can be made to embodiments of the disclosure. FIGS. 6A-6B are cross-sectional views of various stages of a process for forming a semiconductor device structure, in accordance with some embodiments.

As shown in FIG. 6A, a structure similar to the structure shown in FIG. 2C is provided. In some embodiments, a barrier layer 202" is deposited over the sidewalls and the bottoms of the trenches 112A and 112B after the formation of the conductive features 204A and 204B. In some embodiments, the conductive features 204A and 204B are formed using a selective deposition process such as an electroless plating process or a selective CVD process. The conductive material is selectively deposited only on the metal surface without on the surface of the dielectric layer 108. In some embodiments, the material and formation method of the barrier layer 202" are similar to or the barrier layer 202.

Afterwards, processes similar to or the same as those illustrated in FIGS. 2D-2G are performed to form the structure shown in FIG. 6B, in accordance with some embodiments.

Embodiments of the disclosure use a catalyst layer to assist in the formation of conductive features of interconnection structures. With the assistance of the catalyst layer, the subsequent formation the conductive features are significantly improved. For example, the growth temperature of the conductive features is greatly reduced. The conductive features may be made of a 2D material with better conductivity and/or better electromigration resistance than copper. Therefore, the quality and reliability of the interconnection structures are significantly improved.

In accordance with some embodiments, a semiconductor device structure is provided. The semiconductor device structure includes a semiconductor substrate and a dielectric layer over the semiconductor substrate. The semiconductor device structure also includes a conductive feature in the dielectric layer, and the conductive feature includes a catalyst layer and a conductive element. The catalyst layer is between the conductive element and the dielectric layer, and the catalyst layer is in physical contact with the conductive element. The catalyst layer continuously surrounds a sidewall and a bottom of the conductive element. The catalyst layer is made of a material that is different from that of the conductive element, and the catalyst layer is capable of lowering a formation temperature of the conductive element.

In accordance with some embodiments, a semiconductor device structure is provided. The semiconductor device structure includes a semiconductor substrate and a dielectric layer over the semiconductor substrate. The semiconductor device structure also includes a conductive feature in the dielectric layer, and the conductive feature includes a catalyst layer and a conductive element. The catalyst layer is between the conductive element and the dielectric layer, and the conductive element substantially fills a space surrounded by the catalyst layer. The conductive element has a greater conductivity than copper, and the catalyst layer is capable of lowering a formation temperature of the conductive element.

In accordance with some embodiments, a method for forming a semiconductor device structure is provided. The method includes forming a dielectric layer over a semiconductor substrate and forming an opening in the dielectric layer. The method also includes forming a catalyst layer over a sidewall and a bottom of the opening. The method further includes forming a conductive element directly on the catalyst layer. The catalyst layer is capable of lowering a formation temperature of the conductive element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device structure, comprising:
a semiconductor substrate;
a dielectric layer over the semiconductor substrate;
a conductive feature in the dielectric layer, wherein:

the conductive feature comprises a catalyst layer and a conductive element, the catalyst layer is between the conductive element and the dielectric layer, the catalyst layer is in physical contact with the conductive element, the catalyst layer continuously surrounds a sidewall and a bottom of the conductive element, and the catalyst layer is made of a material different from that of the conductive element; and a second conductive feature electrically connected to the conductive feature, wherein a bottom of the second conductive feature is between a top of the conductive element and a top of the catalyst layer.

2. The semiconductor device structure as claimed in claim 1, wherein the conductive element comprises graphene, doped graphene, graphene oxide, graphene-containing compound, transition-metal chalcogenide, boron nitride, or a combination thereof.

3. The semiconductor device structure as claimed in claim 1, wherein the conductive element comprises a two-dimensional (2D) material.

4. The semiconductor device structure as claimed in claim 1, wherein the conductive feature comprises a conductive line.

5. The semiconductor device structure as claimed in claim 1, wherein the conductive feature comprises a conductive via.

6. The semiconductor device structure as claimed in claim 1, wherein the catalyst layer comprises Cu, Ni, Pt, Co, Ru, or a combination thereof.

7. The semiconductor device structure as claimed in claim 1, wherein a portion of the conductive element gradually becomes wider along a direction from a top towards a bottom of the conductive element.

8. The semiconductor device structure as claimed in claim 1, wherein the conductive feature further comprises a second conductive element surrounded by the conductive element, and the second conductive element is made of a second material different from that of the conductive element.

9. The semiconductor device structure as claimed in claim 8, wherein the material of the catalyst layer and the second material of the second conductive element are substantially the same.

10. The semiconductor device structure as claimed in claim 1, wherein an entirety of the conductive element is in a space surrounded by the catalyst layer.

11. A semiconductor device structure, comprising:
a semiconductor substrate;
a dielectric layer over the semiconductor substrate; and
a conductive feature in the dielectric layer, wherein:
the conductive feature comprises a catalyst layer and a conductive element,
the catalyst layer is between the conductive element and the dielectric layer,
the catalyst layer is in physical contact with the conductive element;
the catalyst layer continuously surrounds a sidewall and a bottom of the conductive element;
the conductive element substantially fills a space surrounded by the catalyst layer,
an entirety of the conductive element is in the space surrounded by the catalyst layer,
the catalyst layer is made of a material different from that of the conductive element, and
the conductive element has a greater conductivity than copper.

12. The semiconductor device structure as claimed in claim 11, wherein the conductive element comprises multiple atomic layers connected together by Van der Waals' force between the atomic layers.

13. The semiconductor device structure as claimed in claim 11, wherein the conductive feature further comprises a second conductive element surrounded by the conductive element, and the second conductive element is made of a second material different from that of the conductive element.

14. The semiconductor device structure as claimed in claim 11, wherein a portion of the conductive element gradually becomes wider along a direction from a top towards a bottom of the conductive element.

15. The semiconductor device structure as claimed in claim 11, further comprising a barrier layer between the catalyst layer and the dielectric layer.

16. The semiconductor device structure as claimed in claim 15, wherein top surfaces of the catalyst layer and the conductive element are not coplanar.

17. A semiconductor device structure, comprising:
a semiconductor substrate;
a dielectric layer over the semiconductor substrate;
a conductive feature surrounded by the dielectric layer, wherein:
the conductive feature comprises a catalyst layer and a conductive element,
the catalyst layer is between the conductive element and the dielectric layer,
the catalyst layer is in physical contact with the conductive element,
the catalyst layer continuously surrounds a sidewall and a bottom of the conductive element,
the conductive element has a greater conductivity than the catalyst layer, and
the catalyst layer is made of a material different from that of the conductive element; and
a second conductive feature electrically connected to the conductive feature, wherein a bottom of the second conductive feature is between a top of the conductive element and a top of the catalyst layer.

18. The semiconductor device structure as claimed in claim 17, wherein the catalyst layer surrounds a recess on the conductive element, and the second conductive feature fills the recess.

19. The semiconductor device structure as claimed in claim 17, wherein top surfaces of the catalyst layer and the conductive element are not coplanar.

20. The semiconductor device structure as claimed in claim 17, wherein the conductive element comprises graphene, doped graphene, graphene oxide, graphene-containing compound, transition-metal chalcogenide, boron nitride, or a combination thereof.

* * * * *